(12) United States Patent
Chien et al.

(10) Patent No.: US 10,334,730 B2
(45) Date of Patent: Jun. 25, 2019

(54) COLOR-CHANGEABLE CAPACITOR PACKAGE STRUCTURE AND COLOR-CHANGEABLE CAPACITOR CASING STRUCTURE THEREOF, AND CIRCUIT BOARD ASSEMBLY

(71) Applicant: APAQ TECHNOLOGY CO., LTD., Miaoli County (TW)

(72) Inventors: Ming-Goo Chien, Taichung (TW); Shih-Shan Liu, Taichung (TW)

(73) Assignee: APAQ TECHNOLOGY CO., LTD., Miaoli County (TW)

( * ) Notice: Subject to any disclaimer, the term of this patent is extended or adjusted under 35 U.S.C. 154(b) by 0 days.

(21) Appl. No.: 15/378,385

(22) Filed: Dec. 14, 2016

(65) Prior Publication Data

US 2018/0063959 A1 Mar. 1, 2018

(30) Foreign Application Priority Data

Aug. 29, 2016 (TW) .............................. 105127685 A

(51) Int. Cl.
| | |
|---|---|
| *H02K 1/18* | (2006.01) |
| *G02F 1/01* | (2006.01) |
| *H01G 2/10* | (2006.01) |
| *H05K 1/18* | (2006.01) |
| *H01G 9/08* | (2006.01) |
| *H01G 2/06* | (2006.01) |
| *H05K 3/34* | (2006.01) |

(52) U.S. Cl.
CPC ............ *H05K 1/181* (2013.01); *G02F 1/0147* (2013.01); *H01G 2/06* (2013.01); *H01G 2/10* (2013.01); *H01G 2/103* (2013.01); *H01G 2/106* (2013.01); *H01G 9/08* (2013.01); *H05K 3/3426* (2013.01); *H05K 2201/10015* (2013.01); *H05K 2201/10757* (2013.01)

(58) Field of Classification Search
CPC .......... H05K 1/181; H05K 2201/10015; G02F 1/0147; H01G 2/103; H01G 2/106
USPC ........................................................ 361/535
See application file for complete search history.

(56) References Cited

U.S. PATENT DOCUMENTS

| | | | | |
|---|---|---|---|---|
| 5,458,992 A | * | 10/1995 | Bailey ................... | G01R 13/403 324/435 |
| 5,491,420 A | * | 2/1996 | Parker .................... | G01D 7/005 324/104 |
| 2012/0055393 A1 | * | 3/2012 | Wang ..................... | G01K 11/12 116/207 |
| 2015/0349344 A1 | * | 12/2015 | Shelekhin ............. | H01M 4/625 429/90 |

(Continued)

*Primary Examiner* — Michael P McFadden
(74) *Attorney, Agent, or Firm* — Li & Cai Intellectual Property (USA) Office

(57) ABSTRACT

The instant disclosure provides a color-changeable capacitor package structure and a color-changeable capacitor casing structure thereof, and a circuit board assembly. The color-changeable capacitor casing structure includes a metal casing, a first covering layer and a second covering layer. The metal casing has an outer surface and an inner surface, and the metal casing has a receiving space for receiving a capacitor. The first covering layer is formed on the outer surface of the metal casing, the second covering layer is formed on the first covering layer, and one of the first covering layer and the second covering layer is a thermochromic layer for showing a color that is changeable according to temperature variation.

3 Claims, 16 Drawing Sheets

(56) References Cited

U.S. PATENT DOCUMENTS

2016/0118196 A1\* 4/2016 Lin ......................... H01G 9/10
361/536

\* cited by examiner

ABLE CAPACITOR
COLOR-CHANGEABLE CAPACITOR PACKAGE STRUCTURE AND COLOR-CHANGEABLE CAPACITOR CASING STRUCTURE THEREOF, AND CIRCUIT BOARD ASSEMBLY

BACKGROUND OF THE INVENTION

1. Field of the Invention

The instant disclosure relates to a capacitor package structure and a capacitor casing structure thereof, and a circuit board assembly, and more particularly to a color-changeable capacitor package structure and a color-changeable capacitor casing structure thereof, and a circuit board assembly using the color-changeable capacitor package structure.

2. Description of Related Art

Various applications of capacitors include home appliances, computer motherboards and peripherals, power supplies, communication products and automobiles. The capacitors such as winding-type capacitors are mainly used to provide filtering, bypassing, rectifying, coupling, blocking or transforming function. Because the thin film capacitor has the advantages of small size, large electrical capacity and good frequency characteristic, it can be used as a decoupling element in the power circuit of a central processing unit (CPU). The winding-type capacitor includes a capacitor core, a casing, and a sealing cover. The capacitor core has an anode foil coupled to an anode terminal, a cathode foil coupled to a cathode terminal, a separator, and an electrolyte layer. The anode foil, the cathode foil and the separator are rolled together. The separator is disposed between the anode foil and the cathode foil. The electrolyte layer is formed between the anode foil and the cathode foil. The casing has an opening for receiving the capacitor core. The sealing cover can be used to seal the casing, and the anode terminal and the cathode terminal can pass through a through hole of the sealing cover. A given space is provided between the sealing cover and the capacitor core. A stopper for securing the space is provided on at least one of the anode terminal and the cathode terminal. However, the color of a coating layer that is coated on the casing of the winding-type capacitor is not changeable.

SUMMARY OF THE INVENTION

One aspect of the instant disclosure relates to a color-changeable capacitor package structure and a color-changeable capacitor casing structure thereof, and a circuit board assembly using the color-changeable capacitor package structure.

One of the embodiments of the instant disclosure provides a color-changeable capacitor casing structure, comprising: a thermochromic layer for showing a color that is changeable according to temperature variation. More particularly, the color-changeable capacitor casing structure further comprises a metal casing, a first covering layer and a second covering layer. The metal casing has an outer surface and an inner surface, and the metal casing has a receiving space for receiving a capacitor. The first covering layer is formed on the outer surface of the metal casing. The second covering layer is formed on the first covering layer. One of the first covering layer and the second covering layer is the thermochromic layer.

Another one of the embodiments of the instant disclosure provides a color-changeable capacitor package structure, comprising: a capacitor structure, a color-changeable capacitor casing structure and a bottom sealing structure. The capacitor structure includes a capacitor and two conductive pins extended outwardly from the capacitor. The color-changeable capacitor casing structure is used for receiving the capacitor, and the color-changeable capacitor casing structure includes a thermochromic layer for showing a color that is changeable according to temperature variation. The bottom sealing structure is disposed on a bottom portion of the color-changeable capacitor casing structure, and one part of each conductive pin passes through the bottom sealing structure and exposed outside the bottom sealing structure.

Yet another one of the embodiments of the instant disclosure provides a circuit board assembly, comprising: a circuit substrate and a plurality of electronic components. The electronic components are disposed on the circuit substrate and electrically connected to the circuit substrate, and one of the electronic components is a color-changeable capacitor casing structure, and the color-changeable capacitor casing structure includes a capacitor structure, a color-changeable capacitor casing structure and a bottom sealing structure. The capacitor structure includes a capacitor and two conductive pins extended outwardly from the capacitor. The color-changeable capacitor casing structure is used for receiving the capacitor, and the color-changeable capacitor casing structure includes a thermochromic layer for showing a color that is changeable according to temperature variation. The bottom sealing structure is disposed on a bottom portion of the color-changeable capacitor casing structure, and one part of each conductive pin passes through the bottom sealing structure and exposed outside the bottom sealing structure.

Therefore, the color of the thermochromic layer is changeable according to temperature variation of the heat source due to the features of "the first covering layer being formed on the outer surface of the metal casing, and the second covering layer being formed on the first covering layer" and "one of the first covering layer and the second covering layer being a thermochromic layer for showing a color that is changeable according to temperature variation". On the other hand, if the thermochromic layer is replaced by a color display layer for showing a color that is changeable by receiving a light source, the color of the color display layer is changeable by receiving the light source.

To further understand the techniques, means and effects of the instant disclosure, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DETAILED DESCRIPTION OF THE PREFERRED EMBODIMENTS

Embodiments of a color-changeable capacitor package structure and a color-changeable capacitor casing structure thereof, and a circuit board assembly according to the instant disclosure are described herein. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

First Embodiment

Figure 1:
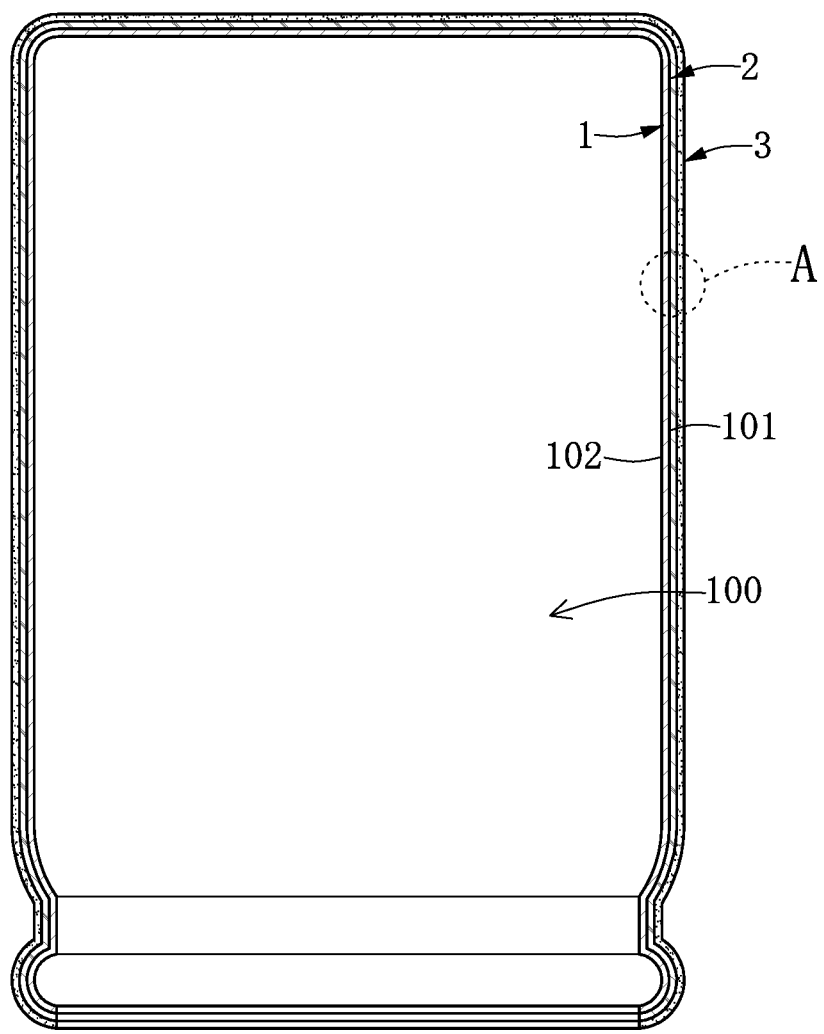
FIG. 1 shows a cross-sectional schematic view of the color-changeable capacitor casing structure according to the first embodiment of the instant disclosure.
Figure 2:
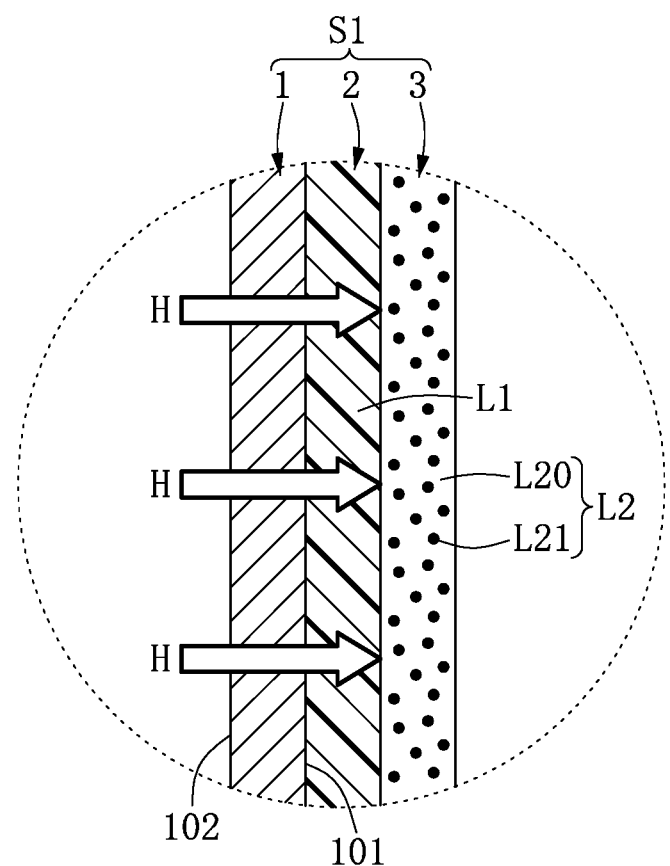
FIG. 2 shows an enlarged view taken on part A of FIG. 1.
Figure 13:
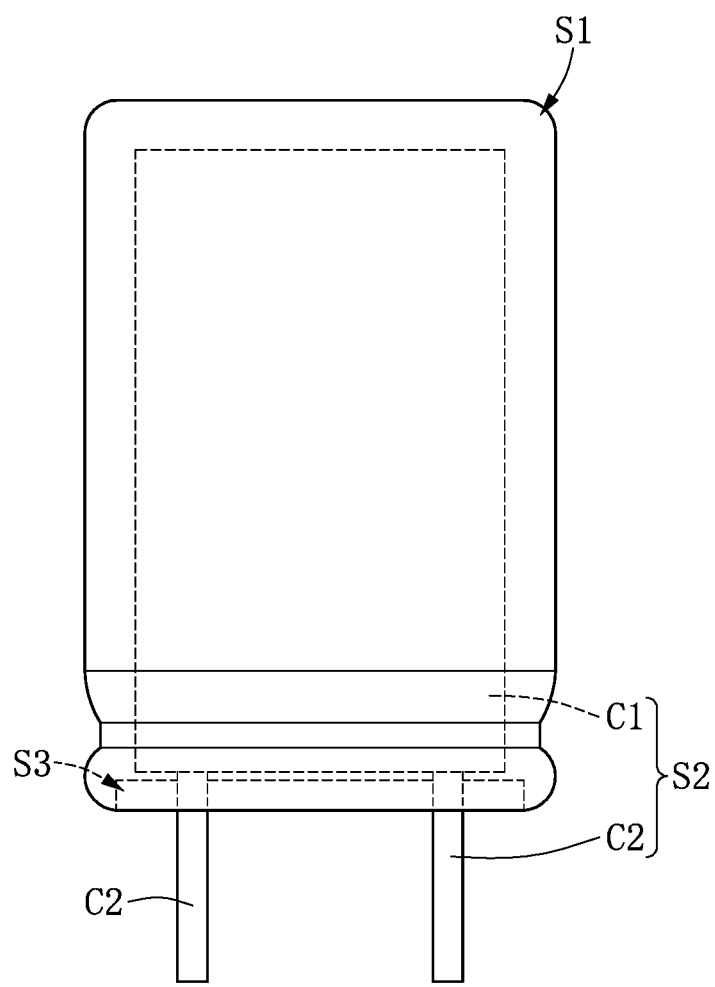
FIG. 13 shows a schematic view of one type of color-changeable capacitor package structure according to the tenth embodiment of the instant disclosure.

Referring to FIG. 1 and FIG. 2, the first embodiment of the instant disclosure provides a color-changeable capacitor casing structure S1, comprising: a metal casing 1, a first covering layer 2 and a second covering layer 3. The metal casing 1 has an outer surface 101 and an inner surface 102, and the metal casing 1 has a receiving space 100 for receiving a capacitor C1 (as shown in FIG. 13). In addition, the first covering layer 2 is formed on the outer surface 101 of the metal casing 1, the second covering layer 3 is formed on the first covering layer 2, and one of the first covering layer 2 and the second covering layer 3 is a thermochromic layer L2 for showing a color that is changeable according to temperature variation. For example, the second covering layer 3 is the thermochromic layer L2 for showing a color that is changeable according to temperature variation.

More particularly, as shown in FIG. 2, the first covering layer 2 may be an insulation material layer L1 for covering the outer surface 101 of the metal casing 1, and the second covering layer 3 may be the thermochromic layer L2 for covering the insulation material layer L1. Therefore, heat source H generated by the capacitor C1 (as shown in FIG. 13) is transmitted to the thermochromic layer L2 through the metal casing 1 and the insulation material layer L1 in sequence so as to change the color of the thermochromic layer L2 according to different temperatures of the heat source H.

For example, the thermochromic layer L2 can be made of at least one of thermochromic materials or formed by mixing a gel material L20 and a plurality of thermochromic particles L21, such that the thermochromic layer L2 can be firmly formed on the insulation material layer L1 by using the gel material L20. That is to say, when the thermochromic layer L2 is made of at least one thermochromic material, the whole thermochromic layer L2 is the thermochromic material. When the thermochromic layer L2 is formed by mixing the gel material L20 and the thermochromic particles L21, only one part of the thermochromic layer L2 is the thermochromic material (shown as the black circular areas in FIG. 2). In addition, the thermochromic material may be inorganic or organic matter. For example, the inorganic matter may be $Ag_2HgI_4$, $Cu_2HgI_4$, $Tl_2HgI_4$, ZnO, $N_2O_4$, $Na_2O_2$, or $[(CH_3)_2CHNH_2]CuCl_3$.

Because the color of the thermochromic layer L2 is changeable according to temperature variation of the heat source H, the thermochromic layer L2 can show different colors corresponding to different temperatures of the heat source H generated by the capacitor C1 (as shown in FIG. 13). Hence, the thermochromic layer L2 can provide different visual effects according to different temperatures of the heat source H generated by the capacitor C1, such that it is very convenient for a user to know what temperature the capacitor C1 is and whether the temperature of the capacitor C1 is too high so as to decrease the temperature of the capacitor C1. In addition, the thermochromic layer L2 can provide different temperature distributions according to different temperatures of the heat source H generated by the capacitor C1, such that it is very convenient for a tester to know the temperature distribution of the capacitor C1 so as to improve (uniform) the temperature distribution of the capacitor C1.

Second Embodiment

Figure 3:
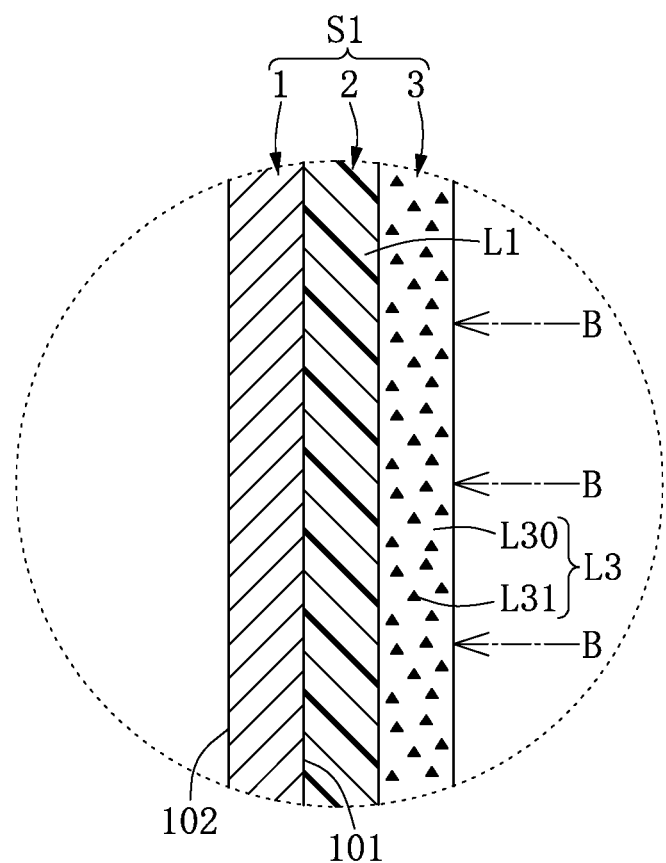
FIG. 3 shows a partial cross-sectional schematic view of the color-changeable capacitor casing structure according to the second embodiment of the instant disclosure.

Referring to FIG. 3, the second embodiment of the instant disclosure provides a color-changeable capacitor casing structure S1, comprising: a metal casing 1, a first covering layer 2 and a second covering layer 3. Comparing FIG. 3 with FIG. 2, the difference between the second embodiment and the first embodiment is as follows: in the second embodiment, one of the first covering layer 2 and the second covering layer 3 is a color display layer for showing a color that is changeable by receiving a light source B. For example, the color display layer is a photochromic layer L3 for showing a color that is changeable according to wavelength variation of the light source B, and the light source B may be an external light source or an internal light source.

More particularly, the first covering layer 2 is an insulation material layer L1 for covering the outer surface 101 of the metal casing 1, and the second covering layer 3 is the photochromic layer L3 for covering the insulation material layer L1. Therefore, the light source B is projected onto the photochromic layer L3 so as to change the color of the photochromic layer L3 according to different wavelengths of the light source B.

For example, the photochromic layer L3 can be made of at least one of photochromic materials or formed by mixing a gel material L30 and a plurality of photochromic particles L31, such that the photochromic layer L3 can be firmly formed on the insulation material layer L1 by using the gel material L30. That is to say, when the photochromic layer L3 is made of at least one photochromic material, the whole photochromic layer L3 is the photochromic material. When the photochromic layer L3 is formed by mixing the gel material L30 and the photochromic particles L31, only one part of the photochromic layer L3 is the photochromic material (shown as the black triangular areas in FIG. 3). In addition, the photochromic material may be silver halide such as AgCl or AgBr.

Because the color of the photochromic layer L3 is changeable according to wavelength variation of the light source B, the photochromic layer L3 can show different colors corresponding to different wavelengths of the light source B that is projected onto the photochromic layer L3 of the capacitor C1 (as shown in FIG. 13). Hence, the photochromic layer L3 can provide different visual effects according to different wavelengths of the light source B that is projected onto the photochromic layer L3 of the capacitor C1.

Please note that the second covering layer 3 may be a color-changeable layer that is formed by mixing the thermochromic particles L21 and the photochromic particles L31. When the color of the thermochromic particle L21 is changed by receiving the heat source H that is generated by the capacitor C1, the color of the photochromic particle L31 is changed by receiving the light source that is generated by the thermochromic particle L21.

Third Embodiment

Figure 4:
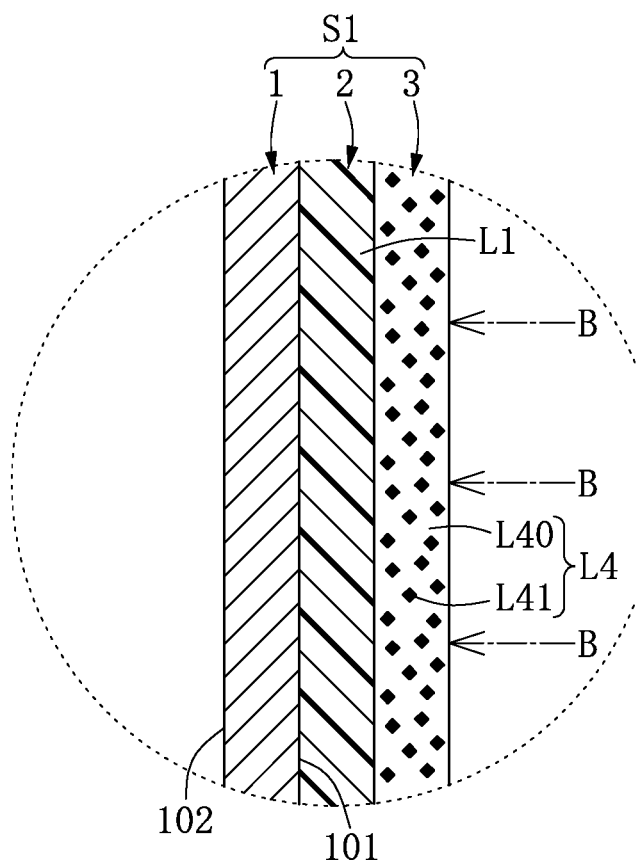
FIG. 4 shows a partial cross-sectional schematic view of the color-changeable capacitor casing structure according to the third embodiment of the instant disclosure.

Referring to FIG. 4, the third embodiment of the instant disclosure provides a color-changeable capacitor casing structure S1, comprising: a metal casing 1, a first covering layer 2 and a second covering layer 3. Comparing FIG. 4 with FIG. 2, the difference between the third embodiment and the first embodiment is as follows: in the third embodiment, one of the first covering layer 2 and the second covering layer 3 is a color display layer for showing a color that is changeable by receiving a light source B. For example, the color display layer is a fluorescent layer L4 for showing a color that is changeable by receiving the light source B, and the light source B may be an external light source or an internal light source.

More particularly, the first covering layer 2 is an insulation material layer L1 for covering the outer surface 101 of the metal casing 1, and the second covering layer 3 is the fluorescent layer L4 for covering the insulation material layer L1. Therefore, the light source B is projected onto the fluorescent layer L4 so as to change the color of the fluorescent layer L4 by receiving the light source B.

For example, the fluorescent layer L4 can be made of at least one of fluorescent materials or formed by mixing a gel material L40 and a plurality of fluorescent particles L41, such that the fluorescent layer L4 can be firmly formed on the insulation material layer L1 by using the gel material L40. That is to say, when the fluorescent layer L4 is made of at least one fluorescent material, the whole fluorescent layer L4 is the fluorescent material. When the fluorescent layer L4 is formed by mixing the gel material L40 and the fluorescent particles L41, only one part of the fluorescent layer L4 is the fluorescent material (shown as the black rhomboid areas in FIG. 4).

Therefore, because the color of the fluorescent layer L4 is changeable by receiving the light source B, the fluorescent layer L4 can provide different visual effects by receiving different light source B that is projected onto the fluorescent layer L4 of the capacitor C1.

Please note that the second covering layer 3 may be a color-changeable layer that is formed by mixing the thermochromic particles L21 and the fluorescent particles L41. When the color of the thermochromic particle L21 is changed by receiving the heat source H that is generated by the capacitor C1, the color of the fluorescent particle L41 is changed by receiving the light source that is generated by the thermochromic particle L21.

Fourth Embodiment

Figure 5:
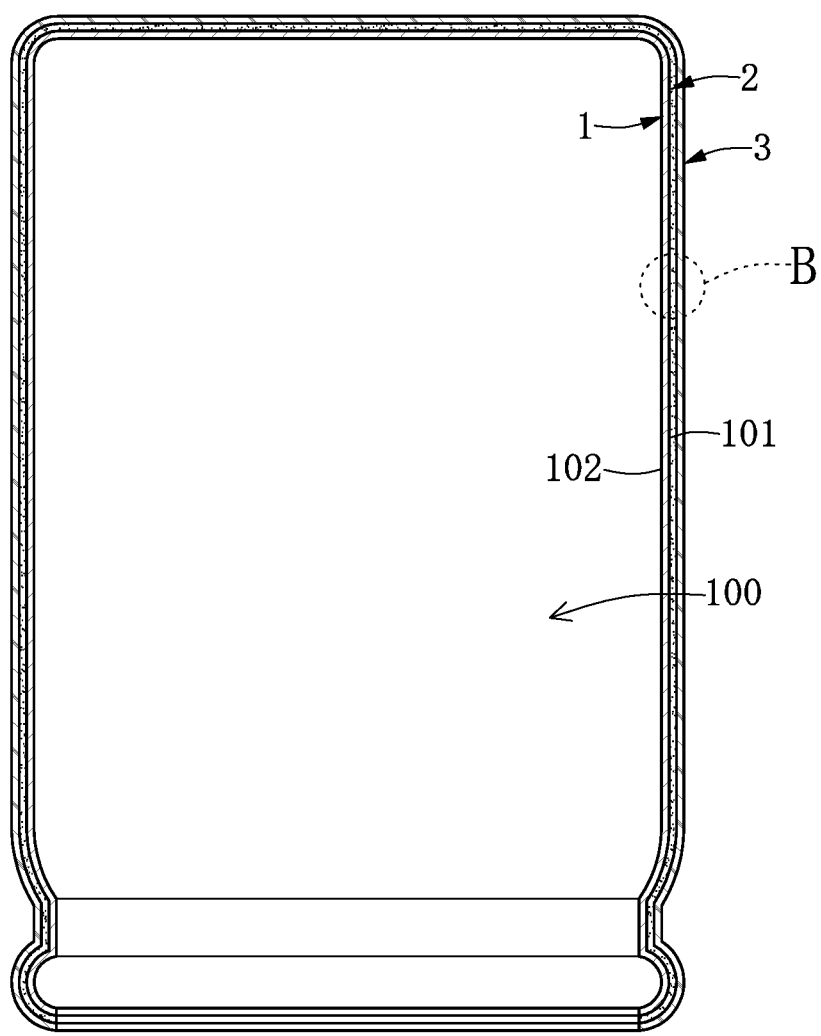
FIG. 5 shows a cross-sectional schematic view of the color-changeable capacitor casing structure according to the fourth embodiment of the instant disclosure.
Figure 6:
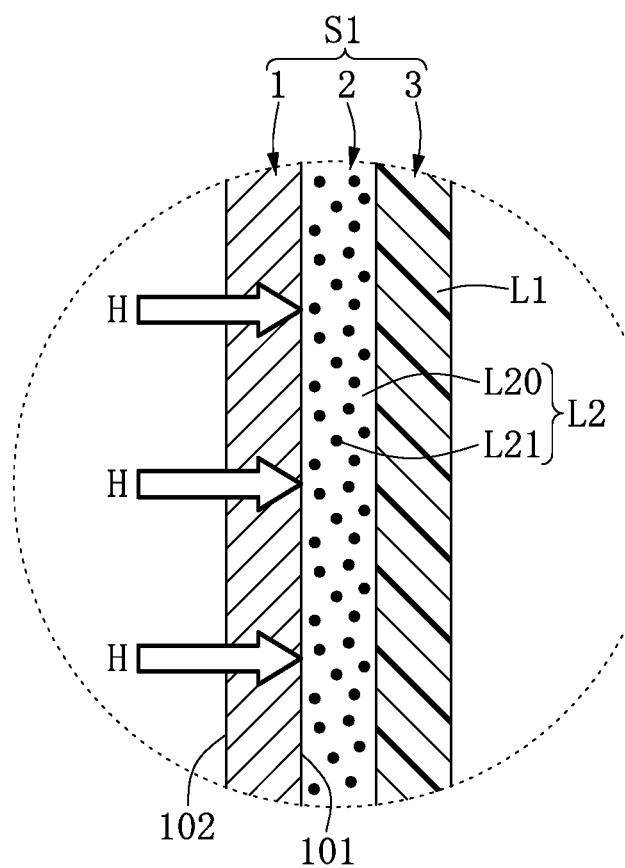
FIG. 6 shows an enlarged view taken on part B of FIG. 5.

Referring to FIG. 5 and FIG. 6, the fourth embodiment of the instant disclosure provides a color-changeable capacitor casing structure S1, comprising: a metal casing 1, a first covering layer 2 and a second covering layer 3. The metal casing 1 has an outer surface 101 and an inner surface 102, and the metal casing 1 has a receiving space 100 for receiving a capacitor C1 (as shown in FIG. 13). In addition, the first covering layer 2 is formed on the outer surface 101 of the metal casing 1, the second covering layer 3 is formed on the first covering layer 2, and one of the first covering layer 2 and the second covering layer 3 is a thermochromic layer L2 for showing a color that is changeable according to temperature variation. For example, the thermochromic layer L2 can be made of at least one of thermochromic materials or formed by mixing a gel material L20 and a plurality of thermochromic particles L21.

Comparing FIG. 5 with FIG. 1 and comparing FIG. 6 with FIG. 2, the difference between the fourth embodiment and the first embodiment is as follows: in the fourth embodiment, the first covering layer 2 is the thermochromic layer L2 for showing a color that is changeable according to temperature variation. More particularly, the first covering layer 2 may be the thermochromic layer L2 for covering the outer surface 101 of the metal casing 1, and the second covering layer 3 may be an insulation material layer L1 for covering the thermochromic layer L2. Therefore, heat source H generated by the capacitor C1 (as shown in FIG. 13) is transmitted to the thermochromic layer L2 through the metal casing 1 so as to change the color of the thermochromic layer L2 according to different temperatures of the heat source H. Therefore, the thermochromic layer L2 can provide different colors according to different temperatures of the heat source H respectively.

Fifth Embodiment

Figure 7:
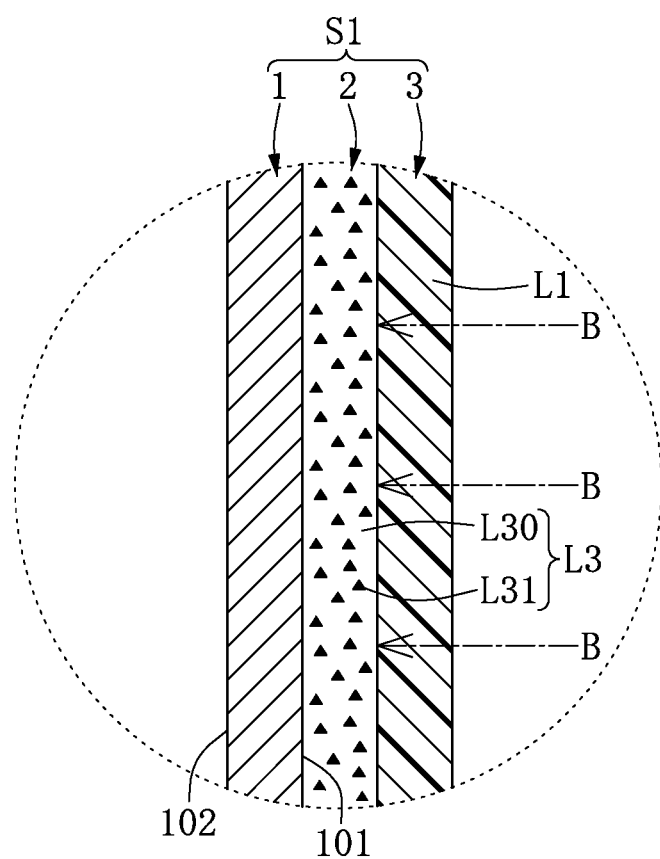
FIG. 7 shows a partial cross-sectional schematic view of the color-changeable capacitor casing structure according to the fifth embodiment of the instant disclosure.

Referring to FIG. 7, the fifth embodiment of the instant disclosure provides a color-changeable capacitor casing structure S1, comprising: a metal casing 1, a first covering layer 2 and a second covering layer 3. Comparing FIG. 7 with FIG. 6, the difference between the fifth embodiment and the fourth embodiment is as follows: in the fifth embodiment, one of the first covering layer 2 and the second covering layer 3 is a color display layer for showing a color that is changeable by receiving a light source B. For example, the color display layer is a photochromic layer L3 for showing a color that is changeable according to wavelength variation of the light source B, and the light source B may be an external light source or an internal light source.

More particularly, the first covering layer 2 is the photochromic layer L3 for covering the outer surface 101 of the metal casing 1, and the second covering layer 3 is an insulation material layer L1 for covering the photochromic layer L3. Therefore, the light source B can pass through the insulation material layer L1 and is projected onto the photochromic layer L3 so as to change the color of the photochromic layer L3 according to different wavelengths of the light source B. For example, the photochromic layer L3 can be made of at least one of photochromic materials or formed by mixing a gel material L30 and a plurality of photochromic particles L31.

Sixth Embodiment

Figure 8:
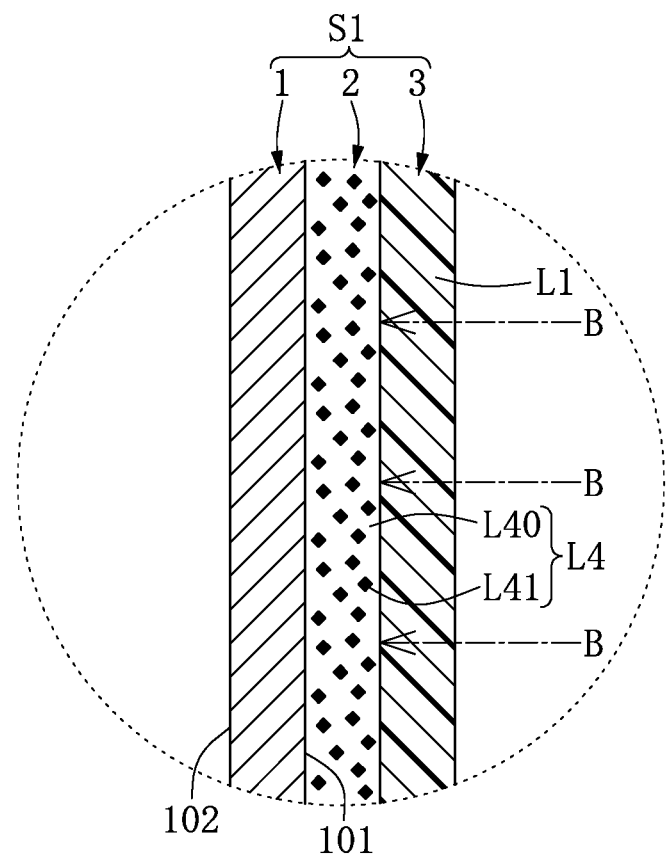
FIG. 8 shows a partial cross-sectional schematic view of the color-changeable capacitor casing structure according to the sixth embodiment of the instant disclosure.

Referring to FIG. 8, the sixth embodiment of the instant disclosure provides a color-changeable capacitor casing structure S1, comprising: a metal casing 1, a first covering layer 2 and a second covering layer 3. Comparing FIG. 8 with FIG. 6, the difference between the sixth embodiment and the fourth embodiment is as follows: in the sixth embodiment, one of the first covering layer 2 and the second covering layer 3 is a color display layer for showing a color that is changeable by receiving a light source B. For example, the color display layer is a fluorescent layer L4 for showing a color that is changeable by receiving the light source B, and the light source B may be an external light source or an internal light source.

More particularly, the first covering layer 2 is the fluorescent layer L4 for covering the outer surface 101 of the metal casing 1, and the second covering layer 3 is an insulation material layer L1 for covering the fluorescent layer L4. Therefore, the light source B can pass through the insulation material layer L1 and is projected onto the fluorescent layer L4 so as to change the color of the fluorescent layer L4 by receiving the light source B. For example, the fluorescent layer L4 can be made of at least one of fluorescent materials or formed by mixing a gel material L40 and a plurality of fluorescent particles L41.

Seventh Embodiment

Figure 9:
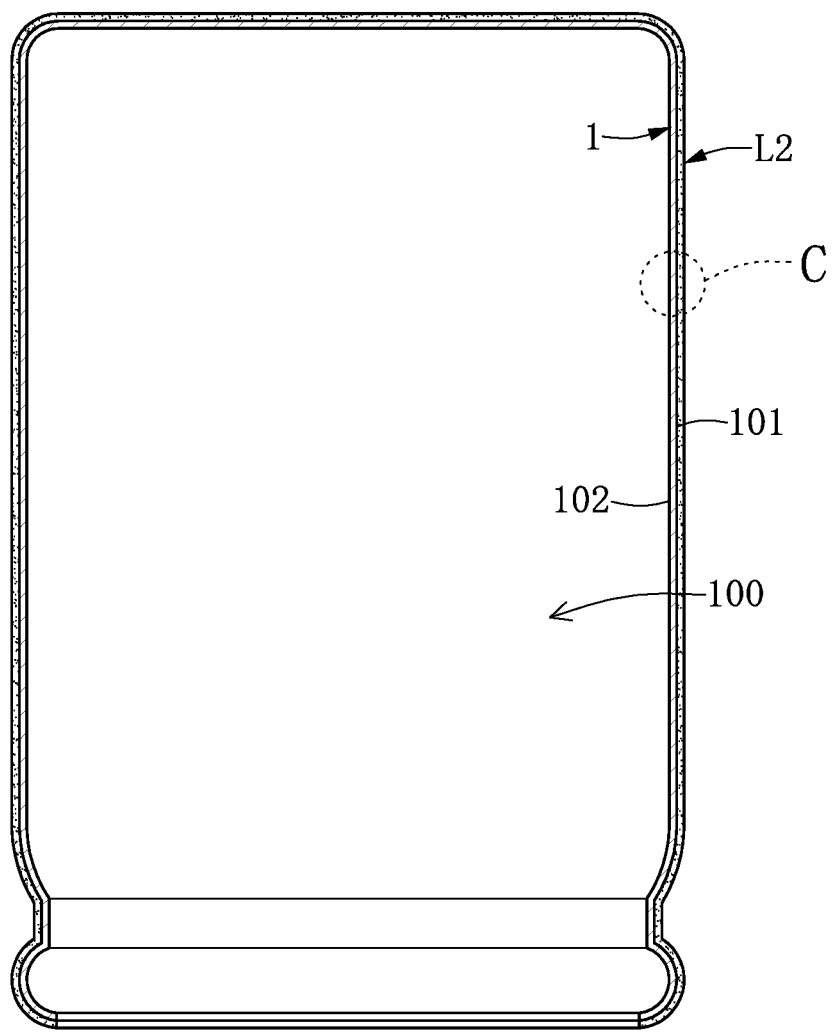
FIG. 9 shows a cross-sectional schematic view of the color-changeable capacitor casing structure according to the seventh embodiment of the instant disclosure.
Figure 10:
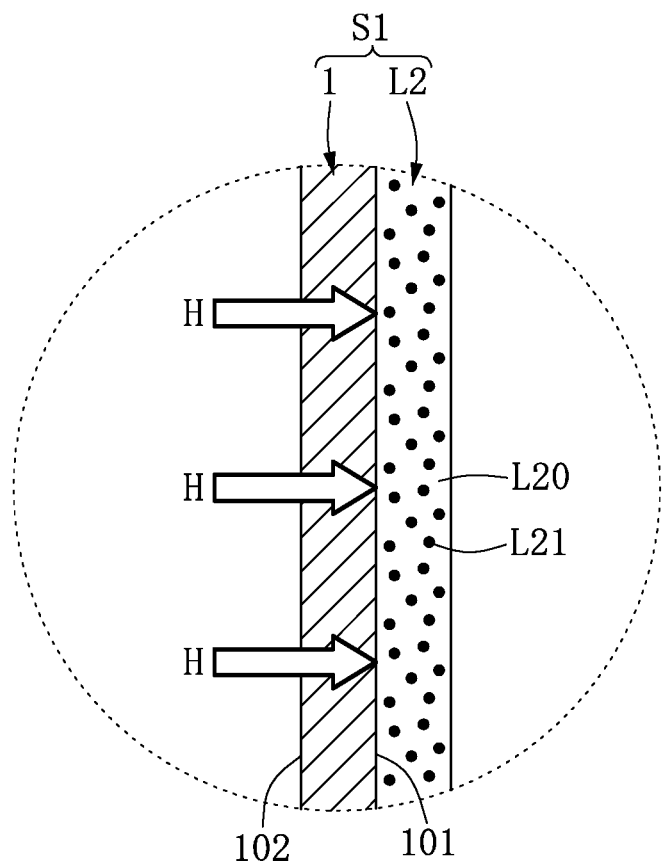
FIG. 10 shows an enlarged view taken on part C of FIG. 9.

Referring to FIG. 9 and FIG. 10, the seventh embodiment of the instant disclosure provides a color-changeable capacitor casing structure S1, comprising: a thermochromic layer L2 for showing a color that is changeable according to temperature variation. More particularly, the color-changeable capacitor casing structure S1 further comprises a metal casing 1 having an outer surface 101 and an inner surface 102, and the metal casing 1 has a receiving space 100 for receiving a capacitor C1 (as shown in FIG. 13), the thermochromic layer L2 is an outermost layer formed on the outer surface 101 of the metal casing 1 and exposed outwardly, and the thermochromic layer L2 can be formed by mixing a gel material L20 and a plurality of thermochromic particles L21.

Eighth Embodiment

Figure 11:
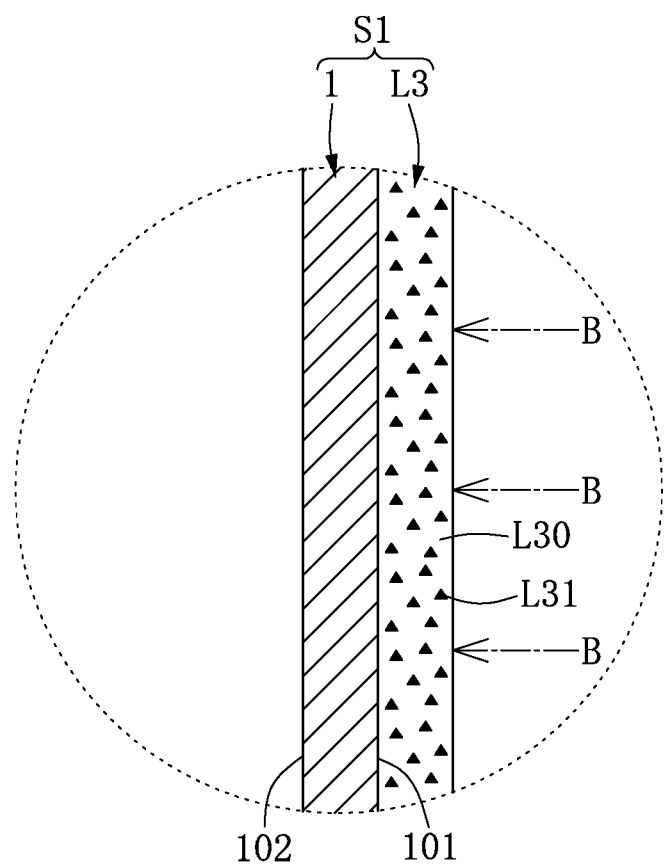
FIG. 11 shows a partial cross-sectional schematic view of the color-changeable capacitor casing structure according to the eighth embodiment of the instant disclosure.

Referring to FIG. 11, the eighth embodiment of the instant disclosure provides a color-changeable capacitor casing structure S1. Comparing FIG. 11 with FIG. 10, the difference between the eighth embodiment and the seventh embodiment is as follows: in the eighth embodiment, the color-changeable capacitor casing structure S1 comprises a color display layer for showing a color that is changeable by receiving a light source B. For example, the color display layer is a photochromic layer L3 for showing a color that is changeable according to wavelength variation of the light source B. In addition, the photochromic layer L3 is an outermost layer formed on the outer surface 101 of the metal casing 1 and exposed outwardly, and the photochromic layer L3 can be formed by mixing a gel material L30 and a plurality of photochromic particles L31.

Ninth Embodiment

Figure 12:
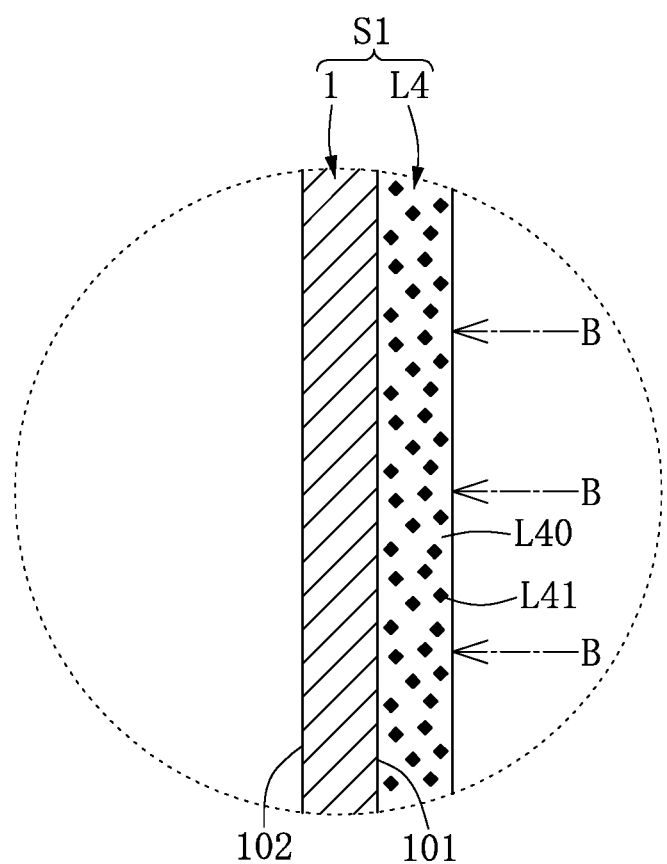
FIG. 12 shows a partial cross-sectional schematic view of the color-changeable capacitor casing structure according to the ninth embodiment of the instant disclosure.

Referring to FIG. 12, the ninth embodiment of the instant disclosure provides a color-changeable capacitor casing structure S1. Comparing FIG. 12 with FIG. 10, the difference between the ninth embodiment and the seventh embodiment is as follows: in the ninth embodiment, the color-changeable capacitor casing structure S1 comprises a color display layer for showing a color that is changeable by receiving a light source B. For example, the color display layer is a fluorescent layer L4 for showing a color that is changeable according to wavelength variation of the light source B. In addition, the fluorescent layer L4 is an outermost layer formed on the outer surface 101 of the metal casing 1 and exposed outwardly, and the fluorescent layer L4 can be formed by mixing a gel material L40 and a plurality of fluorescent particles L41.

Tenth Embodiment

Referring to FIG. 13, the tenth embodiment of the instant disclosure provides a color-changeable capacitor package structure P, comprising: a capacitor structure S2, a color-changeable capacitor casing structure S1 and a bottom sealing structure S3.

Referring to FIG. 1 (or FIG. 5) and FIG. 13, the capacitor structure S2 includes a capacitor C1 and two conductive pins C2 extended outwardly from the capacitor C1. In addition, the color-changeable capacitor casing structure S1 is used for receiving the capacitor C1, and the color-changeable capacitor casing structure S1 includes a metal casing 1, a first covering layer 2 and a second covering layer 3. More particularly, the metal casing 1 has an outer surface 101 and an inner surface 102, and the metal casing 1 has a receiving space 100 for receiving a capacitor C1. In addition, the bottom sealing structure S3 is disposed on a bottom portion of the color-changeable capacitor casing structure S1 for sealing the receiving space 100, and one part of each conductive pin C2 passes through the bottom sealing structure S3 and exposed outside the bottom sealing structure S3.

Following the above description, the first covering layer 2 is formed on the outer surface 102 of the metal casing 1, and the second covering layer 3 is formed on the first covering layer 1. For example, one of the first covering layer 2 and the second covering layer 3 is a thermochromic layer L2 for showing a color that is changeable according to temperature variation, that is to say the color-changeable capacitor casing structure S1 of the first embodiment (as shown in FIG. 2) or the fourth embodiment (as shown in FIG. 6) can be applied to the color-changeable capacitor package structure P of the tenth embodiment according to different requirements. For another example, one of the first covering layer 2 and the second covering layer 3 is a color display layer for showing a color that is changeable by receiving a light source B, that is to say the color-changeable capacitor casing structure S1 of the second embodiment (as shown in FIG. 3), the third embodiment (as shown in FIG. 4), the fifth embodiment (as shown in FIG. 7) or the sixth embodiment (as shown in FIG. 8) can be applied to the color-changeable capacitor package structure P of the tenth embodiment according to different requirements.

Figure 15:
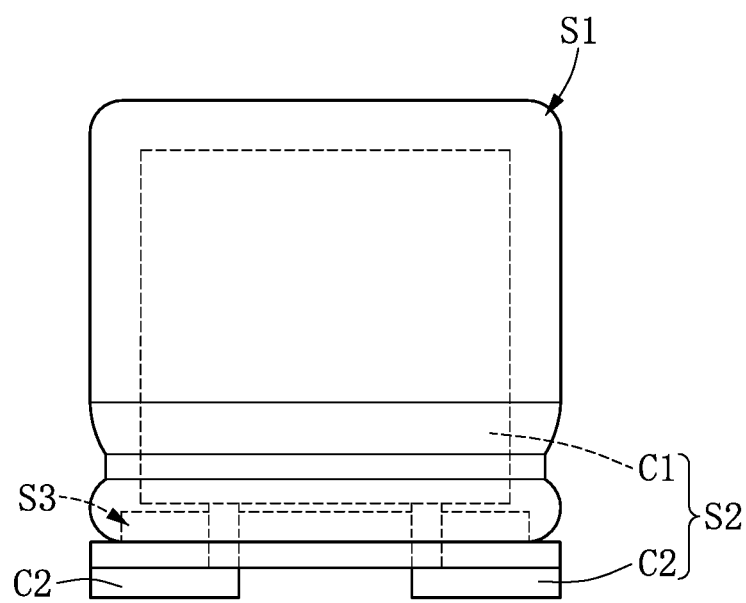
FIG. 15 shows a schematic view of another type of color-changeable capacitor package structure according to the tenth embodiment of the instant disclosure.

Please note that FIG. 13 shows a schematic view of one type of color-changeable capacitor package structure according to the tenth embodiment of the instant disclosure, and FIG. 15 shows a schematic view of another type of color-changeable capacitor package structure according to the tenth embodiment of the instant disclosure. Hence, the color-changeable capacitor package structure P as shown in FIG. 13 and the color-changeable capacitor package structure P as shown in FIG. 15 are two different types of capacitor package structures.

Eleventh Embodiment

Figure 14:
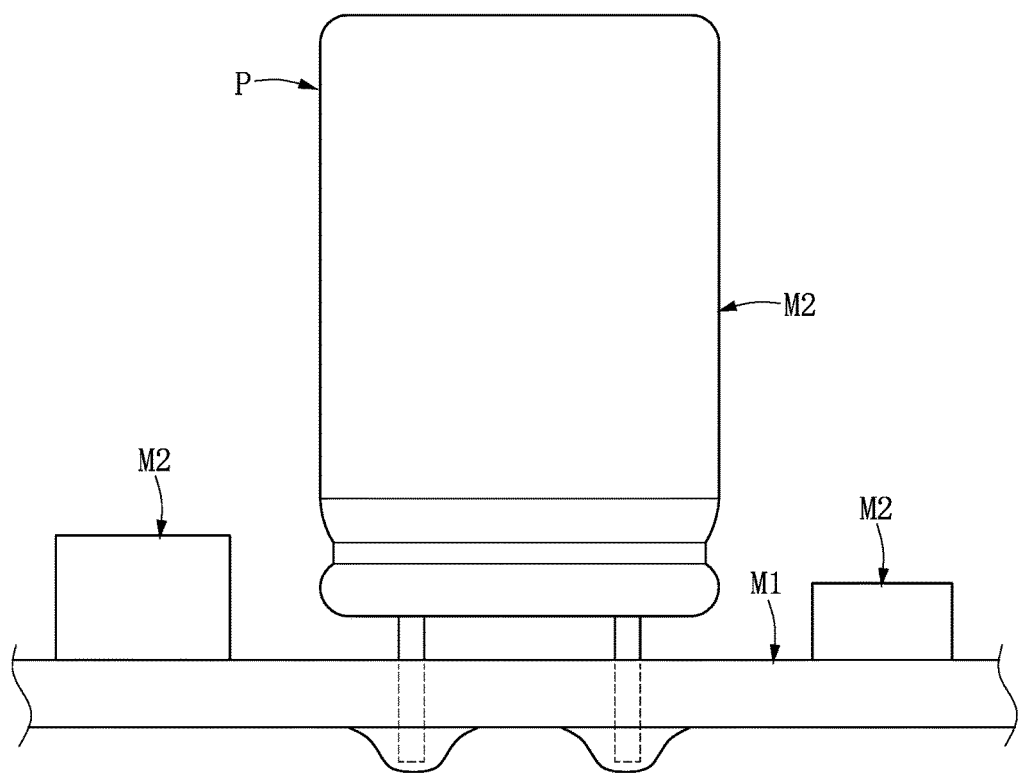
FIG. 14 shows a schematic view of one type of circuit board assembly according to the eleventh embodiment of the instant disclosure.

Referring to FIG. 14, the eleventh embodiment of the instant disclosure provides a circuit board assembly Z, comprising: a circuit substrate M1 and a plurality of electronic components M2, and the electronic components M2 is disposed on the circuit substrate M1 and electrically connected to the circuit substrate M1. In addition, one of the electronic components M2 is a color-changeable capacitor casing structure P, and the color-changeable capacitor casing structure P includes a capacitor structure S2, a color-changeable capacitor casing structure S1 and a bottom sealing structure S3 (as shown in FIG. 13). Please note that one of the electronic components M2 is a color detector for detecting whether the color of the color-changeable capacitor casing structure P is changed or not.

Referring to FIG. 1 (or FIG. 5), FIG. 13 and FIG. 14, the capacitor structure S2 includes a capacitor C1 and two conductive pins C2 extended outwardly from the capacitor C1. In addition, the color-changeable capacitor casing structure S1 is used for receiving the capacitor C1, and the color-changeable capacitor casing structure S1 includes a metal casing 1, a first covering layer 2 and a second covering layer 3. More particularly, the metal casing 1 has an outer surface 101 and an inner surface 102, and the metal casing 1 has a receiving space 100 for receiving a capacitor C1. In addition, the bottom sealing structure S3 is disposed on a bottom portion of the color-changeable capacitor casing structure S1 for sealing the receiving space 100, and one part of each conductive pin C2 passes through the bottom sealing structure S3 and exposed outside the bottom sealing structure S3.

Following the above description, the first covering layer 2 is formed on the outer surface 102 of the metal casing 1, and the second covering layer 3 is formed on the first covering layer 1. For example, one of the first covering layer 2 and the second covering layer 3 is a thermochromic layer L2 for showing a color that is changeable according to temperature variation, that is to say the color-changeable capacitor casing structure S1 of the first embodiment (as shown in FIG. 2) or the fourth embodiment (as shown in FIG. 6) can be applied to the color-changeable capacitor package structure P of the tenth embodiment according to different requirements. For another example, one of the first covering layer 2 and the second covering layer 3 is a color display layer for showing a color that is changeable by receiving a light source B, that is to say the color-changeable capacitor casing structure S1 of the second embodiment (as shown in FIG. 3), the third embodiment (as shown in FIG. 4), the fifth embodiment (as shown in FIG. 7) or the sixth embodiment (as shown in FIG. 8) can be applied to the color-changeable capacitor package structure P of the tenth embodiment according to different requirements.

Figure 16:
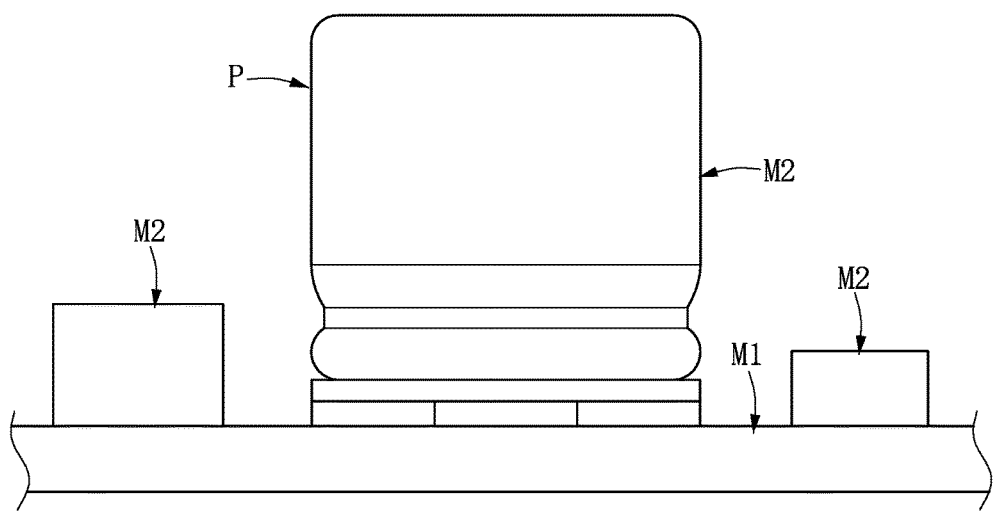
FIG. 16 shows a schematic view of another type of circuit board assembly according to the eleventh embodiment of the instant disclosure.

Please note that FIG. 14 shows a schematic view of one type of circuit board assembly according to the eleventh embodiment of the instant disclosure, and FIG. 16 shows a schematic view of another type of circuit board assembly according to the eleventh embodiment of the instant disclosure. Hence, the color-changeable capacitor package structure P as shown in FIG. 14 and the color-changeable capacitor package structure P as shown in FIG. 16 are two different types of capacitor package structures.

In conclusion, the color of the thermochromic layer L2 is changeable according to temperature variation of the heat source H due to the features of "the first covering layer 2 being formed on the outer surface 101 of the metal casing 1, and the second covering layer 3 being formed on the first covering layer 2" and "one of the first covering layer 2 and the second covering layer 3 being a thermochromic layer L2 for showing a color that is changeable according to temperature variation".

Because the color of the thermochromic layer L2 is changeable according to temperature variation of the heat source H, the thermochromic layer L2 can show different colors corresponding to different temperatures of the heat source H generated by the capacitor C1 (as shown in FIG. 13). Hence, the thermochromic layer L2 can provide different visual effects according to different temperatures of the heat source H generated by the capacitor C1, such that it is very convenient for a user to know what temperature the capacitor C1 is and whether the temperature of the capacitor C1 is too high so as to decrease the temperature of the capacitor C1. In addition, the thermochromic layer L2 can provide different temperature distributions according to different temperatures of the heat source H generated by the capacitor C1, such that it is very convenient for a tester to know the temperature distribution of the capacitor C1 so as to improve (uniform) the temperature distribution of the capacitor C1.

More particularly, because the color of the photochromic layer L3 is changeable according to wavelength variation of the light source B, the photochromic layer L3 can show different colors corresponding to different wavelengths of the light source B that is projected onto the photochromic layer L3 of the capacitor C1 (as shown in FIG. 13). Hence, the photochromic layer L3 can provide different visual effects according to different wavelengths of the light source B that is projected onto the photochromic layer L3 of the capacitor C1. On the other hand, because the color of the fluorescent layer L4 is changeable by receiving the light source B, the fluorescent layer L4 can provide different visual effects by receiving different light source B that is projected onto the fluorescent layer L4 of the capacitor C1.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. A color-changeable capacitor casing structure, comprising:
   a metal casing having an outer surface and an inner surface, wherein the metal casing has a receiving space for receiving the capacitor;
   a first covering layer formed directly on the outer surface of the metal casing; and
   a second covering layer formed directly on the first covering layer;
   wherein, the first covering layer is an insulation material layer for covering the outer surface of the metal casing, and the second covering layer is the thermochromic layer for covering the insulation material layer, wherein a heat source generated by the capacitor is transmitted to the thermochromic layer through the metal casing and the insulation material layer in sequence so as to change the color of the thermochromic layer according to different temperatures of the heat source, wherein the thermochromic layer is made of a thermochromic material or formed by mixing a gel material and a plurality of thermochromic particles.

2. A color-changeable capacitor casing structure, comprising:
   a metal casing having an outer surface and an inner surface, wherein the metal casing has a receiving space for receiving the capacitor;
   a first covering layer formed directly on the outer surface of the metal casing; and
   a second covering layer formed directly on the first covering layer;
   wherein the first covering layer is a thermochromic layer for covering the outer surface of the metal casing, and the second covering layer is an insulation material layer for covering the thermochromic layer, wherein a heat source generated by the capacitor is transmitted to the thermochromic layer through the metal casing so as to change the color of the thermochromic layer according to different temperatures of the heat source, wherein the thermochromic layer is made of a thermochromic material or formed by mixing a gel material and a plurality of thermochromic particles.

3. A color-changeable capacitor package structure, comprising:
   a capacitor structure including a capacitor and two conductive pins extended outwardly from the capacitor;
   a color-changeable capacitor casing structure for receiving the capacitor, includes:
      a metal casing having an outer surface and an inner surface, wherein the metal casing has a receiving space for receiving the capacitor;
      a first covering layer formed directly on the outer surface of the metal casing; and
      a second covering layer formed directly on the first covering layer;
      wherein the first covering layer is a thermochromic layer for covering the outer surface of the metal casing, and the second covering layer is an insulation material layer for covering the thermochromic layer, wherein heat source generated by the capacitor is transmitted to the thermochromic layer through the metal casing so as to change the color of the thermochromic layer according to different temperatures of the heat source, wherein the thermochromic layer is made of a thermochromic material or formed by mixing a gel material and a plurality of thermochromic particles; and
   a bottom sealing structure disposed on a bottom portion of the color-changeable capacitor casing structure, wherein one part of each conductive pin passes through the bottom sealing structure and exposed outside the bottom sealing structure.

* * * * *